United States Patent [19]

Tuttle

[11] Patent Number: 5,189,375

[45] Date of Patent: Feb. 23, 1993

[54] INDUCTIVE CABLE RESISTANCE TESTER

[75] Inventor: John E. B. Tuttle, Falls Church, Va.

[73] Assignee: United States of America as represented by the Secretary of The Army, Washington, D.C.

[21] Appl. No.: 710,200

[22] Filed: Jun. 4, 1991

[51] Int. Cl.$^5$ .............................................. G01R 27/14
[52] U.S. Cl. ................................... 324/537; 324/127; 324/691; 324/601; 324/718; 336/175
[58] Field of Search ............... 324/512, 522, 523, 525, 324/527–530, 537, 541, 544, 601, 691, 710, 713, 715, 718, 127; 313/2.1, 440; 336/175, 176

[56] References Cited

U.S. PATENT DOCUMENTS

| | | | |
|---|---|---|---|
| 3,771,049 | 11/1973 | Picclone | 324/127 |
| 3,783,382 | 1/1974 | Reynolds | 324/710 |
| 3,863,148 | 1/1975 | Fellrath et al. | 324/715 |
| 4,788,470 | 11/1988 | Kohzuki et al. | 313/440 |
| 4,841,229 | 6/1989 | Eccleston | 324/601 |

Primary Examiner—Kenneth A. Wieder
Assistant Examiner—Diep Do
Attorney, Agent, or Firm—Saul Elbaum; Frank J. Dynda

[57] ABSTRACT

A technique and apparatus for measurement of resistances of 0.01 ohm and less without disconnection from the circuit. The invention is used for measurement of degradation in cable shields by measuring the droop caused by circuit resistance in an induced current pulse in the undisconnected circuit. The method can also be used for measurement of junction resistances in high current circuits such as auto starters. The invention allows measurements to be made with the circuits connected so that the faults are present in the measurement setup. The method includes inductive coupling of long duration repetitive current pulses onto the circuit under test, measurement and display of induced current pulses, and display of induced current pulses on an oscilloscope.

2 Claims, 11 Drawing Sheets

INDUCTIVE CABLE RESISTANCE TESTER

RIGHTS OF THE GOVERNMENT

The invention described herein may be manufactured, used and licensed by or for the United States Government for Governmental purposes without payment of any royalty thereon.

BACKGROUND OF THE INVENTION

1. Field of the Invention

The present invention relates generally to methods and apparatus for measurement of very small circuit resistances (0.01 ohm or less) without disconnection of the circuit.

2. Description of the Prior Art

Electromagnetic Pulse (EMP) hardness assurance maintenance and surveillance programs and system life cycle study programs have been established by all branches of the military which have fielded systems with EMP survival requirements. A major portion of these programs is concerned with measurement of cable shield degradation over the lifetime of the system so that short and long term maintenance actions can be planned. To support these programs, several computer based data collection systems featuring network analyzers have been built or are planned. Computer controlled network analyzers provide the capability to collect, process, and store large amounts of high quality data in the form of transfer impedance (Zt) vs frequency plots to 200 MHZ and beyond. These systems emphasize the high frequency response characteristics of the Zt plots to estimate degradation of cable shields. The guiding principle is that holes in the weave of the shield material tend to enlarge as the cable degrades and these cause high frequency resonant peaks to appear in the Zt vs frequency characteristic. Although the use of Zt plots in a 200 MHZ bandwidth allows the data analyst to diagnose cable connector problems accurately and to track gradual deterioration of cable shields over the lifetime of the cable, the method has several drawbacks. First, the cable under test must be disconnected from its equipment and placed in a special cable test fixture. Removal of a cable from its normal environment may eliminate sources of shield degradation which may not be detected in the fixture. The problem may exist in the panel of the equipment from which the cable was removed. Second, the Zt method may yield uninterpretable results at high frequencies when the cable under test is a multi-branch cable. Also, a Zt vs frequency plot may be required for each branch. Third, computer controlled network analyzer systems are very expensive to build and to operate; thus, few systems will be available on short notice and one system may have a heavy case load. Typically, these systems are built into vans or shelters which are periodically transported to sites in the field for scheduled maintenance testing. The time interval between maintenance visits may be as long as a year. Thus, a readily correctable shield flaw may go undetected until the cable can be tested. If the flaw is not with the cable itself, the problem will go undetected despite Zt testing.

The subject inductively coupled low resistance measurement technique is proposed as a very inexpensive complement to the more orthodox method. Since the subject invention can be inexpensively mass produced and can be easily used by relatively unskilled personnel, it may be cost effectively distributed to units in the field. Many of the problems detectable via the subject invention can be repaired on the spot by such actions as cleaning threads on a connector backshell or tightening the coupling nut of a panel connector. With additional effort, the method and apparatus can be adapted to the inspection of conductors in the grounding systems of computer and communications facilities (fixed sites). The method and apparatus could be used to inspect for resistive joints that may develop in ground conductors.

Flaws in the shields of cables can usually be traced to connectors. These flaws which can result from improper bond between cable shield and connector backshell, mechanical stress, or metal oxide buildup at connector junctions, introduce resistances in series with the cable shield and reduce the overall effectiveness of the shield. When such flaws are present, they can be sometimes detected by the above described measurements of transfer impedance vs frequency obtained with a network analyzer or by direct measurement of cable shield resistance obtained with a milliohmeter. The presence of a flaw in the shield will be indicated by an increase in transfer impedance (ohms/length) or shield resistance (ohms) above a previously established maximum allowable value. Typical acceptable values of shield resistance of cables in real systems will range from ten milliohms (0.01 ohm) to several tenths of ohms depending upon such cable parameters as length, diameter, characteristics of the shield material, and allowable junction resistances.

It is not always desirable to attempt detection of cable shield flaws by measurements of transfer impedance or shield resistance by the standard techniques. Both techniques require that the equipment terminating the cable under test be disconnected. When measurements are made on a cable disconnected from its equipment, a serious flaw may go undetected. Disconnection may relieve the mechanical stress that caused the flaw or may eliminate a resistive junction between cable connector and equipment connector. Also, the shield flaw may exist, not within the cable, but at the junction between equipment connector and equipment enclosure. Thus, inspection for flaws in cable shields should be done with the cable connected to its terminating equipment so that all sources of shield degradation will be present in the measurement environment. Therefore, detection of flaws and degradation in cable shields translates to measurement of low valued resistances without disconnecting the circuit under test.

Accordingly, it is an object of the present invention to provide an inductively coupled low resistance measurement method and apparatus which can be used without disconnecting the circuit under test.

It is another object of the present invention to provide an inexpensive cable test set that works in combination with a user supplied portable oscilloscope that provides a continuous display of a pulsed current waveform induced on a cable by the test set.

SUMMARY

Briefly, the foregoing and other objects are achieved by an inductive coupler and coupler driver combination such that long duration current pulses are induced to flow in a cable or shield under test without disconnecting the circuit. The current pulses are sensed by a current probe and displayed continuously on an oscilloscope. A pulsed magnetic field is generated by the inductive coupler/driver combination. When the coupler is connected for use, its core and windings surround the cable under test. A current is induced in the shield or cable and a corresponding magnetic field is established over the length of the cable or shield. The magnetic field established by the induced current is sensed by the current probe which provides a voltage output proportional to the induced cable current. Calibration resistances are used for initial calibration of a cable or cable shield path. By this procedure, the cable under test is initially disconnected at one end and the calibration resistance inserted. From measurements on the cable or shield taken with and without the calibration resistance, a baseline value of end to end cable or cable shield resistance can be obtained for each cable or shield in a system requiring periodic inspection.

BRIEF DESCRIPTION OF THE DRAWINGS

The invention will be better understood if reference is made to the accompanying drawings, in which.

DETAILED DESCRIPTION OF THE INVENTION

Figure 1:
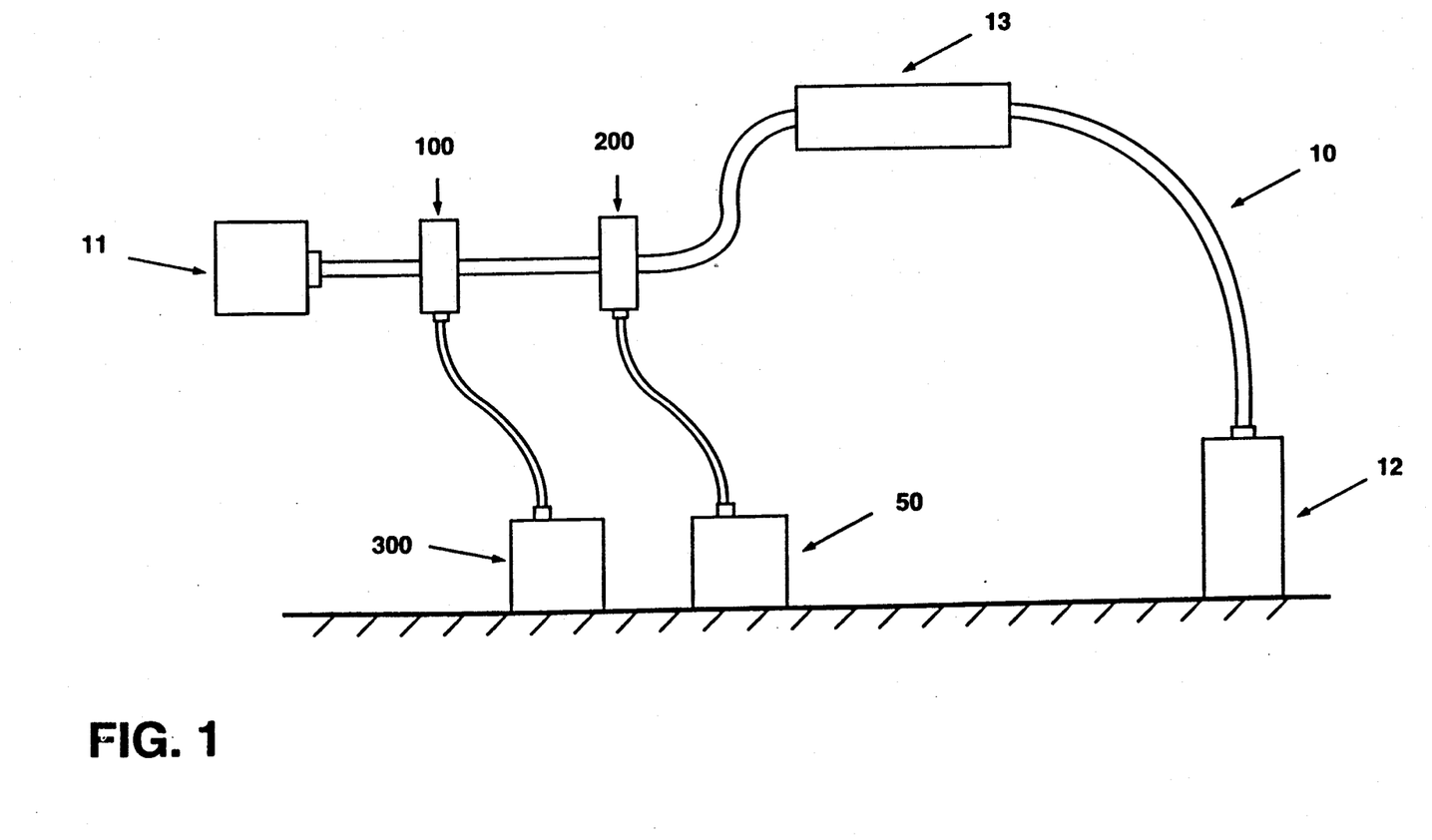
FIG. 1 shows the interior of a typical communications facility with the cable tester installed.

FIG. 1 shows a representative environment (i.e. the interior of a fixed or mobile communications system) where the subject test set may be used to inspect for cable shield degradation. The cable shield 10 under test is shown connecting a wall mounted shielded junction box 11 to a shielded equipment rack 12. A cable tray 13 holds the cable 10. The cable 10 is excited by the inductive coupler 100 which is driven by the coupler driver 300. The current pulses induced in the shield 10 are sensed by the current probe 200 and displayed continuously by the oscilloscope 50. As will be explained later on, the following waveforms are representative of those that can be viewed on the oscilloscope 50.

Figure 2:
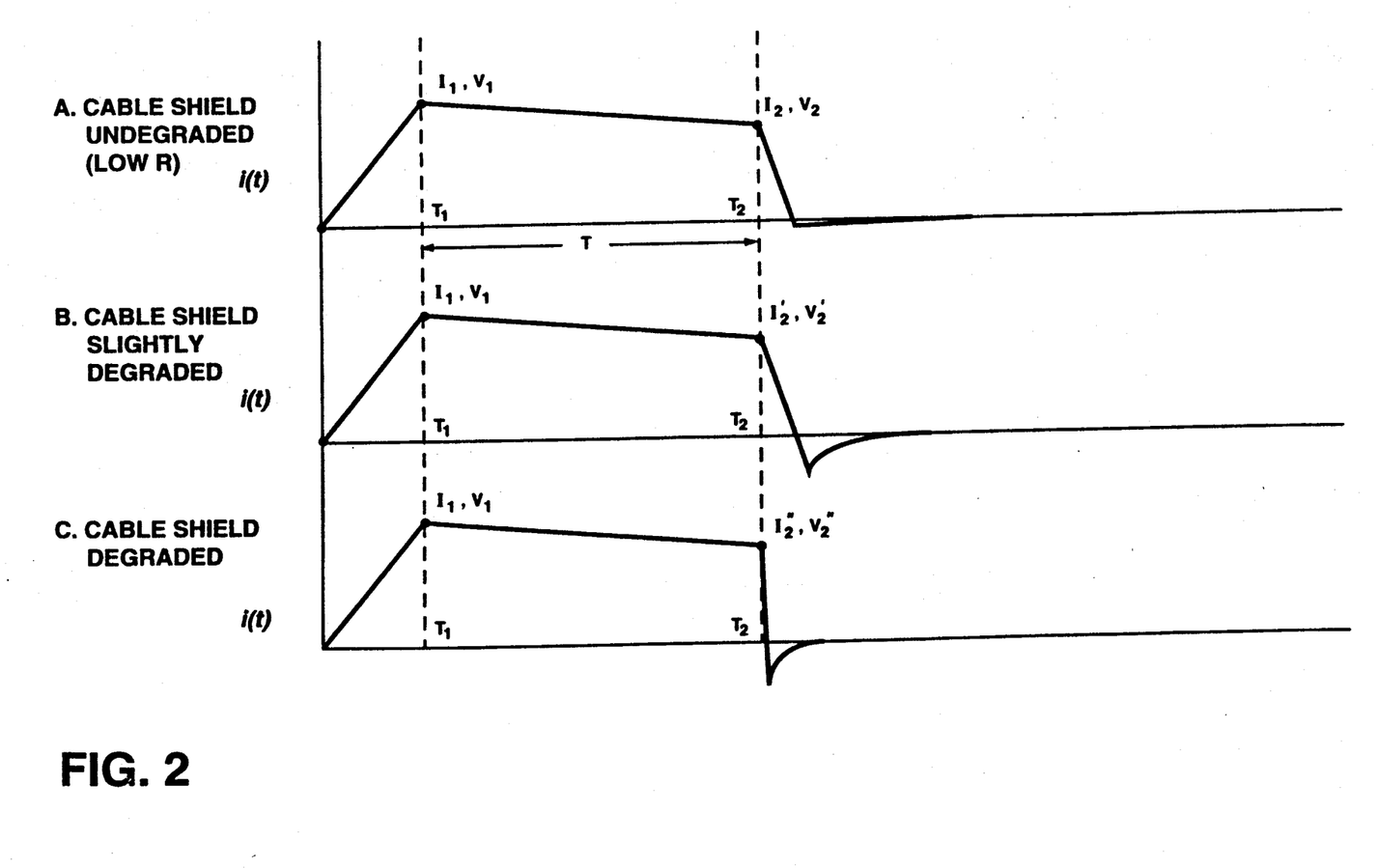
FIG. 2 shows typical cable current vs time waveforms (a,b,and c) that may appear on an oscilloscope display during testing.

The waveform a of FIG. 2 corresponds to the undegraded condition where the end to end resistance of the cable shield is very low. The flat topped portion of the pulse has a very slight droop (negative slope).

The waveform b of FIG. 2 corresponds to the slightly degraded condition in which some connector junction resistance is present. The trapezoid pulse has a conspicuous "droop" (negative slope) and negative undershoot in late time. The presence of resistance in the circuit under test does not necessarily signify a failed shield.

Figure 3:
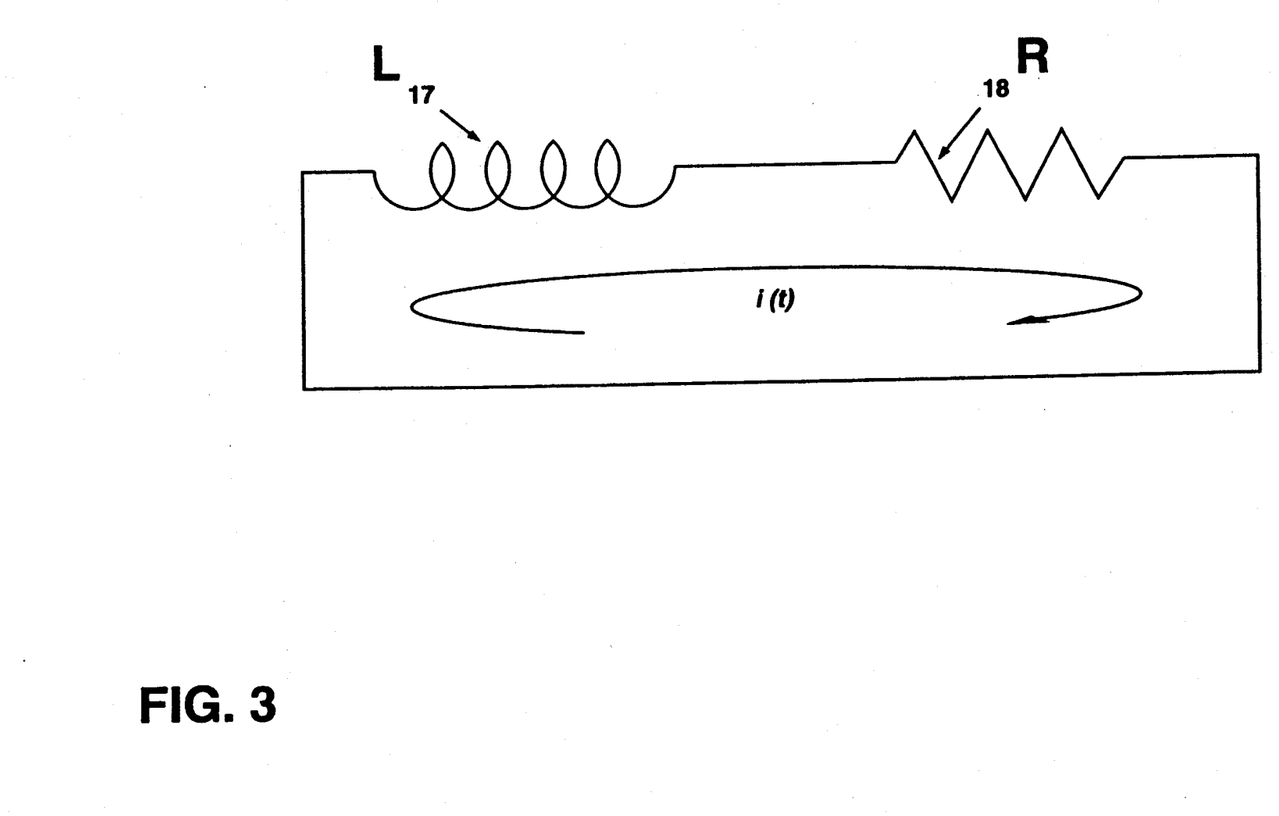
FIG. 3 is a schematic of the equivalent circuit of a cable under test excited by an inductive coupler and loaded by an inductive probe.
Figure 4A:
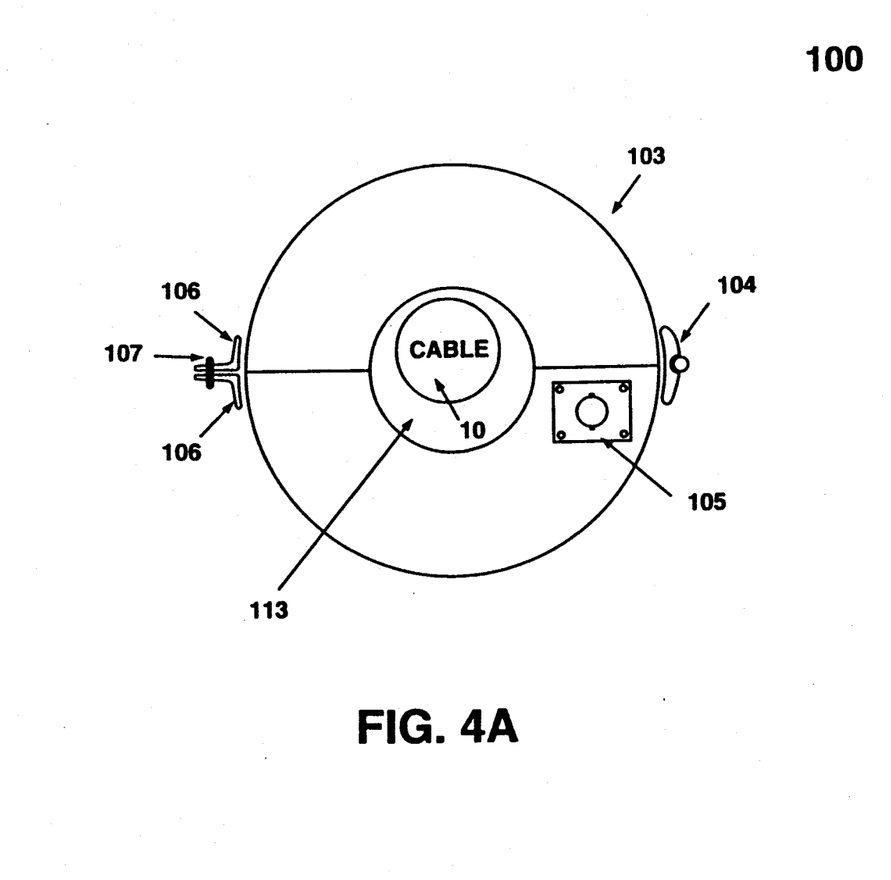
FIG. 4A and 4B show an inductive coupler or current probe installed around a cable under test.
Figure 4B:
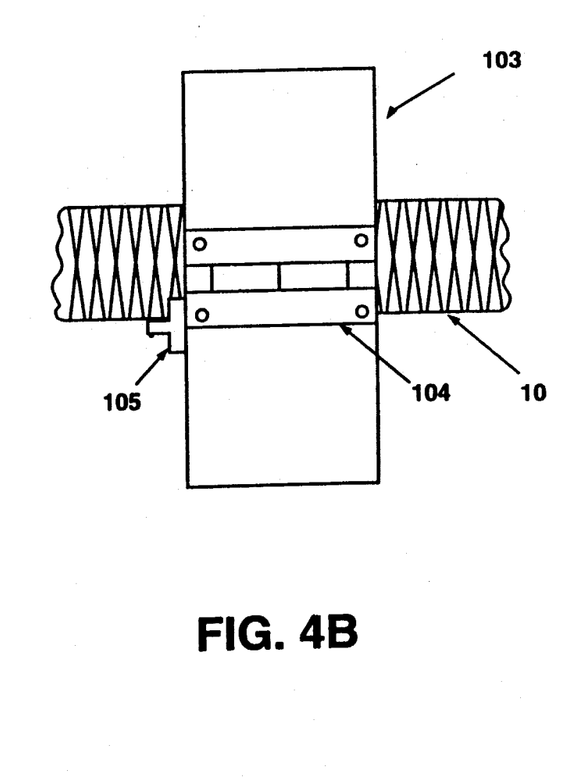
Figure 5:
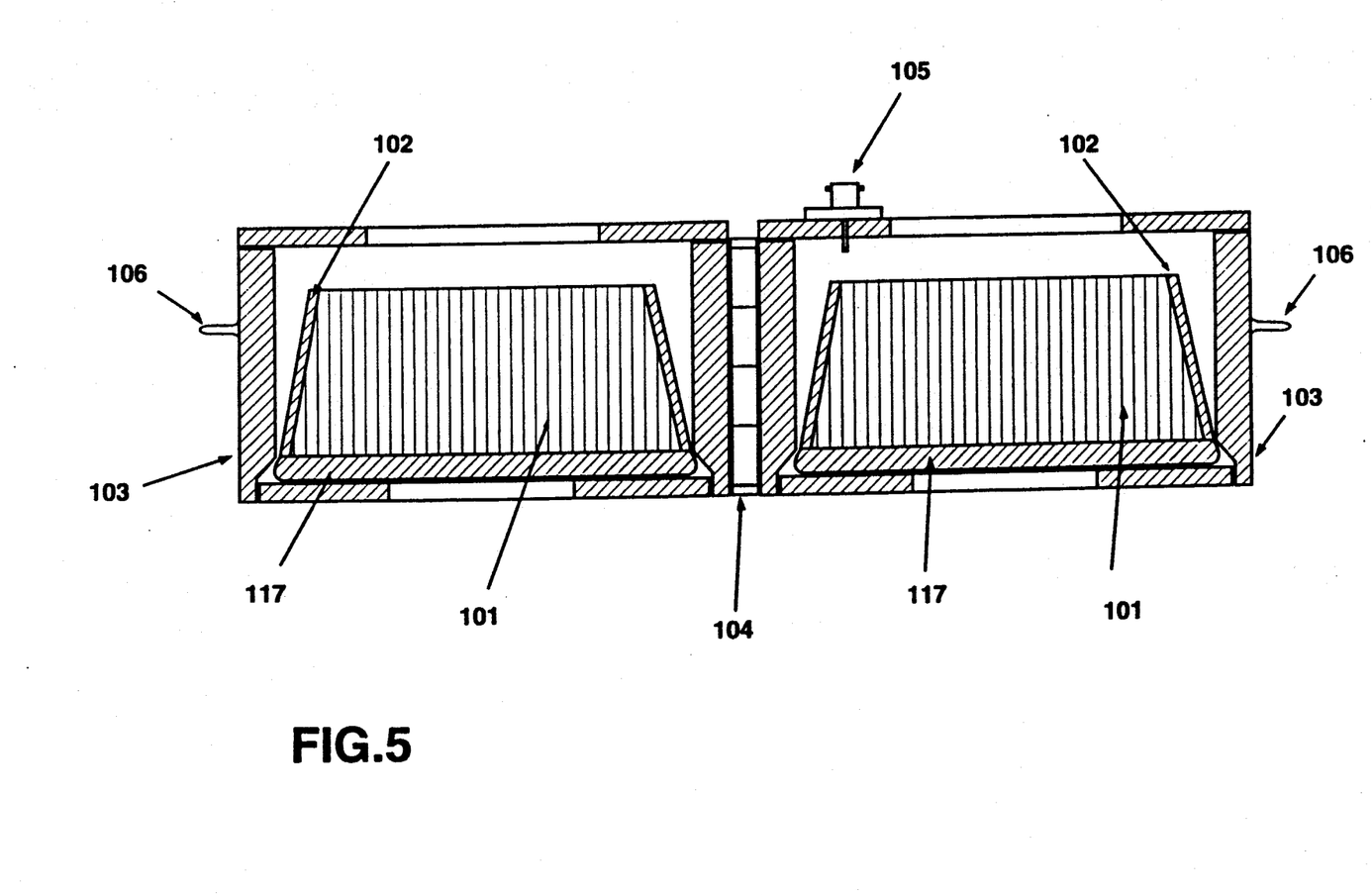
FIG. 5 shows the inductive coupler or current probe in an open condition.

The waveform c of FIG. 2 corresponds to a badly degraded condition in which an unacceptably high resistance is present in series with the shield 10 of the cable under test. The natural time constant (L/R) of most practical shielded cables is in the range of 20 to 50 microseconds for straight lengths. Shielded cables, constructed from good quality metal braid typically have low frequency transfer impedances (Zt) on the order of 0.001 ohm per meter and inductances in the range of 0.02 to 0.05 microhenries per meter. Long duration pulsed magnetic fields with trapezoidal time histories can be easily generated that readily couple to most cables. The natural compatibility that exists between test object (cable shield) and test stimulus (pulsed magnetic field) facilitates the coupling of long duration current pulses whose decay times correspond to the low resistances normally present in cable shield circuits. By observing the time histories (waveforms) of the pulsed shield currents, the decay times and end to end resistances of the cable shields can be determined. The desired values of shield resistance, including flaws, are determined by measurements of pulse droop obtained from visual display of shield current response waveforms. The pulsed magnetic field is generated by the inductive coupler 100 and coupler driver 300 in combination. As shown in FIGS. 4, 5 when the coupler 100 is connected for use, its core 102 and windings 101 surround the cable 10 under test. The coupler driver 300, when active, switches current $i_c(t)$ through the windings of the coupler 100. When the coupler 100 and coupler driver 300 are active, pulsed magnetic field $B_c(t)$ exists in the space 113 between the coupler core and the cable cross section. In response to $B_c(t)$, current i(t) is induced on the shield of the cable and a corresponding magnetic field is established over the length of the cable. The magnetic field established by the induced current is sensed by the current probe 200 which provides a voltage output proportional to the induced cable current. A cable shield 10, excited by the coupler 100 and driver 300 and loaded by the current probe 200, can be represented by the series combination of inductance (L) 17 (Henries) and resistance (R) 18 (Ohms) through which time varying current i(t) flows. The equivalent circuit is shown in FIG. 3 and is valid if there exists continuity between the equipments to which the cable 10 is connected. Referring to FIG. 3, the equation describing i(t) is:

equation 1: $i(t) = I_1 e^{-Rt/L}$ for $t_1 \leq t \leq t_2$

Where:

$I_1$ is the peak value of current induced on the cable;
(R) 18 is the end to end resistance of the cable; and
(L) 17 is the equivalent end to end inductance.

Referring to FIG. 2, it is seen that although i(t) has a trapezoidal waveshape, only the long duration flat region needs to be considered. This region begins at $I_1$, $t_1$ decays to $I_2$, $t_2$ and has a duration of T.

The desired measurement (R in ohms) must be obtained by measurement of droop taken from an oscilloscope display of the i(t) waveform. Droop is defined as:

equation 2a: $D = (I_1 - I_2)/I_1$ or, since the scope display presents voltage proportional to current:

equation 2b: $D = (V_1 - V_2)/V_1$

From equation 1 the derivation $D = (RT)/L$ is obtained. Where D is obtained from the scope display (equation 2b) and T is the width of the droop region. Since both L and R will be unknown, there will be one equation in two unknowns. To obtain the necessary two equations in two unknowns, two measurements of droop ($D_1$ and $D_2$) must be taken; the first ($D_1$) is taken with the circuit as is; the second ($D_2$) is taken with a known value of resistance ($R_c$) inserted; one end of the cable is momentarily disconnected and the known $R_c$ bridges the temporary open. The two equations become:

4a. $D_1 = (R_x T)/L$ and

4b. $D_2 = [(R_x + R_c)T]/L$

Where $R_x$ is the unknown and $R_c$ is the known value of resistance inserted into the cable shield circuit. From 4a and 4b, the unknown resistance is:

equation 5: $R_x = D_1 R_c / D_2 - D_1$

Where $R_x$ is the sum of intrinsic shield resistance $R_{(sh)}$ and any resistances due to flaws or degradation or:

equation 6: $R_x = R_{sh} + R_{(flaw)}$

Equations 1 through 5 are valid on condition that the slope of the trapezoidally varying magnetic field B(t) radiated by the inductive coupler 100 is near zero during T or:

$d/dt B(t) = 0$ for $t_1 \leq t \leq t_2$ and the current probe 200 sampling i(t) introduces no additional droop. For these conditions, all measurements of droop (D) obtained from the scope display will be entirely related to the cable shield resistances.

The initial value of $R_x$ measured serves as a baseline whereby subsequent cable shield degradation can be determined. Follow-up measurements need be performed only with each cable connected to its terminating equipment. Thus, only the $D_1$ measurement will be required.

Figure 6:
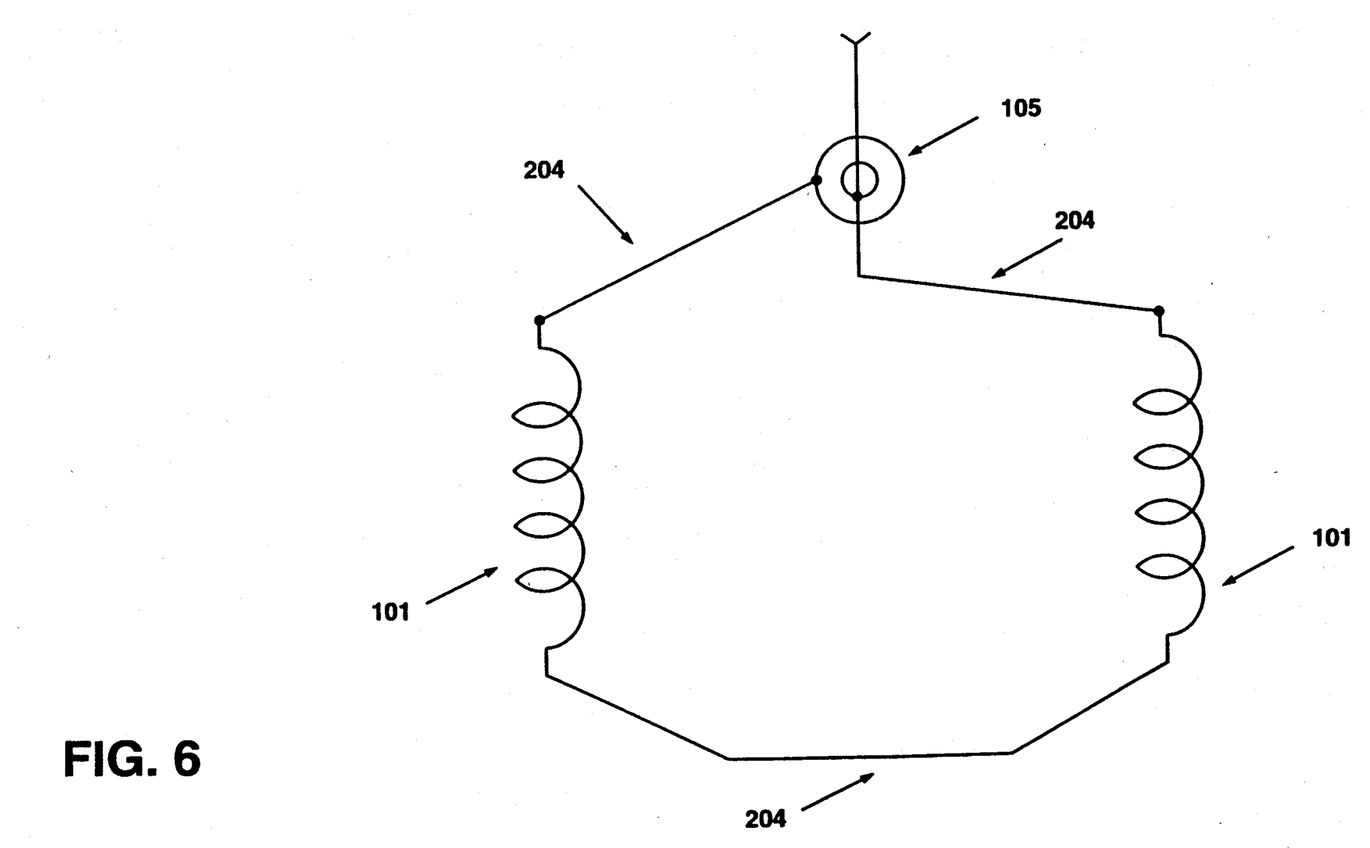
FIG. 6 is the electrical schematic of the inductive coupler.

Referring to FIGS. 4, 5, AND 6, the inductive coupler 100 is a multiple turn coil 101 wound on a TV deflection yoke core 102 and housed within a two-section Plexiglas (a trademark for a lightweight transparent thermoplastic) cylinder 103. Silastic compound 117 is used to hold the yokes 102 and windings 101 to the cylinder 103. Each half core 102 has three layers of windings 101, a total per half core 102 of 190 turns of #22 enamel coated magnet wire. Each layer of windings is separated by tape. The windings 101 on the left and right half cores 102 are connected to provide addition of fluxes. The deflection core 102 used has an initial permeability u=350. The windings 101 are connected to jack 105 with #20 stranded teflon coated wire 204. The two sections of the plexiglas cylinder 103 are joined by hinges 104. When in use, the cylindrically packaged inductive coupler 100 surrounds the cable 10 under test; the two deflection yoke core halves 102 are joined; and the magnetic circuit is completed when connected to the cable 10 under test, the coupler 100 becomes the primary winding 101 of a multiple turn step down transformer and the cable 10 becomes a single turn secondary.

Figure 7:
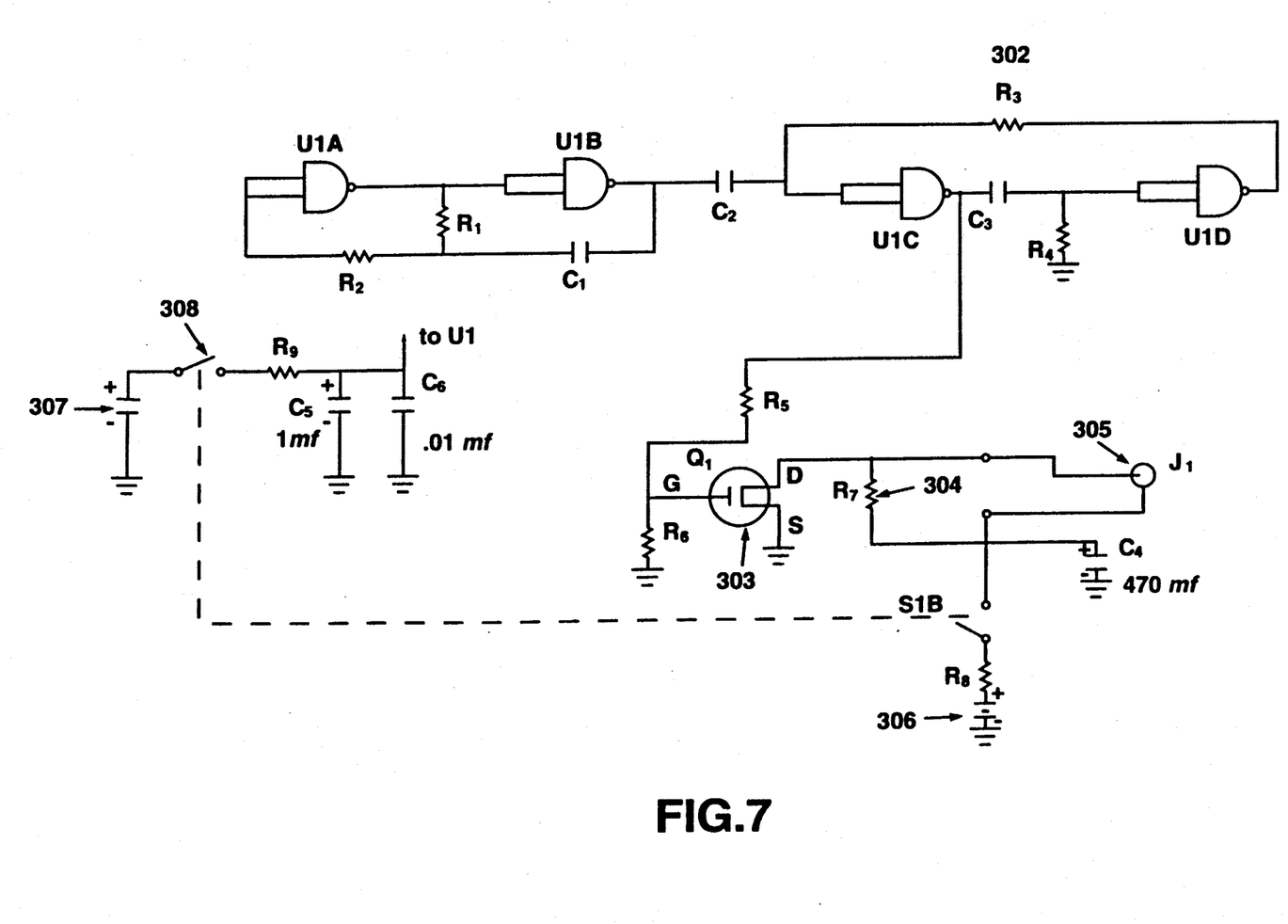
FIG. 7 is the schematic of the inductive coupler driver.

The coupler 100 which induces long duration repetitive current pulses on the shield of the cable 10 is driven by the inductive coupler driver 300. Referring now to FIG. 7, the inductive coupler driver 300 is basically a solid state switch. The "on" time of the driver 300 is controlled by an astable multivibrator 301 and a monostable multivibrator 302. The astable and monostable combination generates a 60 to 70 microsecond pulse with a repetition frequency of 25 Hz. The power switch 303 aNIRF832 MOSFET is powered from dry cell batteries 306 of from 9 to 90 volts as required. A damping resistor 304 is placed across the output jack 305 of the driver 300.

Figure 8:
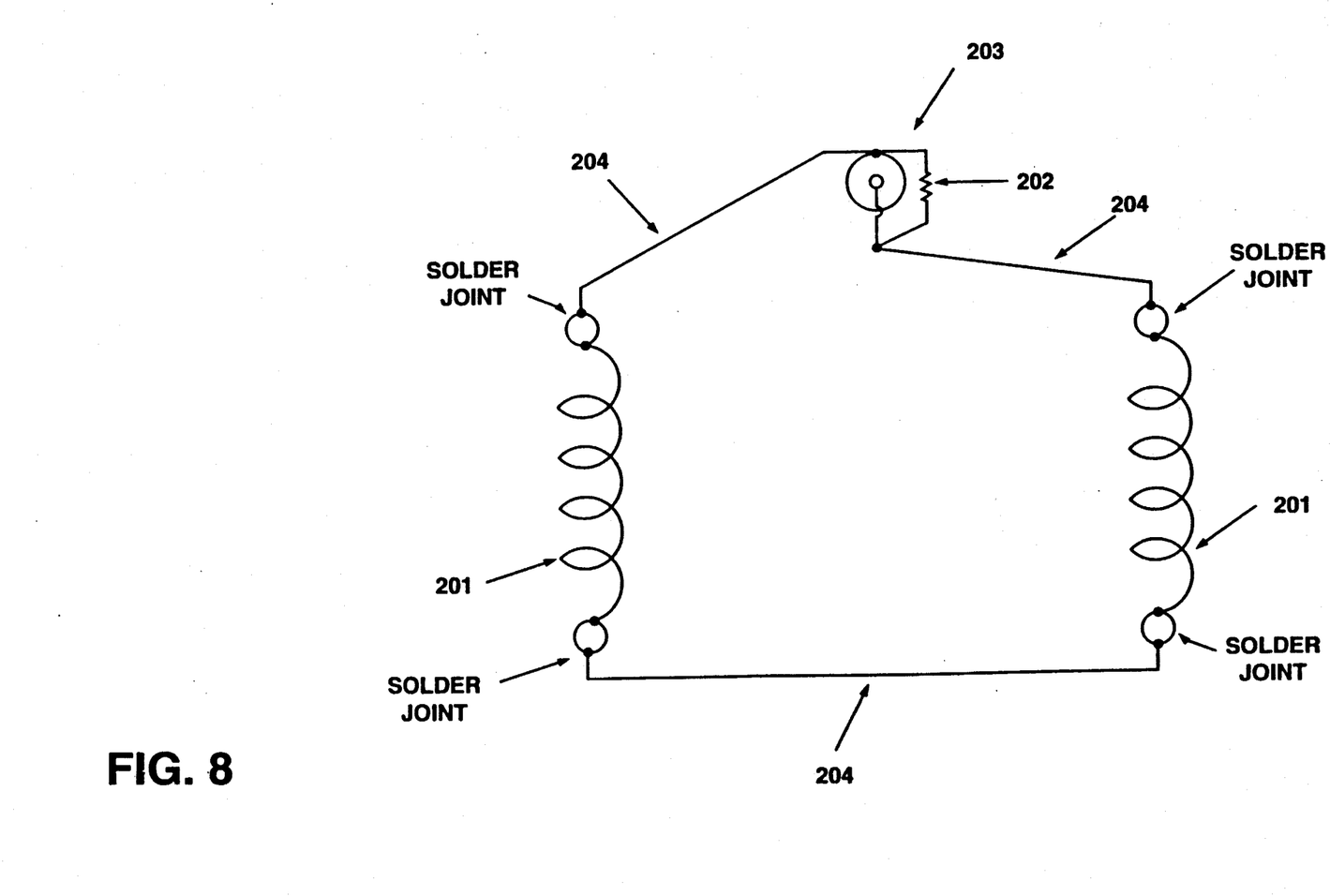
FIG. 8 is an electrical schematic of the current probe.

The astable/monostable 301, 302 combination is powered by a 9 volt dry cell battery 307. Switches 308, and 309 which together comprise a DPDT switch, control the power to the driver 300. The rest of the components of the driver 300 are standard in the industry and are therefore not detailed herein. The output of the coupler driver 300 is connected to the input of the coupler 100 by 50 ohm coaxial cable. The coupler driver 300 is connected to the coupler 100 by means of a coaxial panel jack (bnc type) 105. Two brass hooks 106 fastened to the plexiglas halves 103 are held together by a rubber "O"-ring 107 to keep the two halves of the coupler 100 closed. The current probe 200 is similar in construction to the inductive coupler 100 except that it has fewer turns of wire. Its function is to sense the current induced on the shield of the cable 10 under test and to generate a time varying output voltage proportional to the sampled current. As shown in FIG. 8, the current probe 200 windings 201 consist of 16 turns of #22 enamel coated magnet wire on each core 102. A resistor 202 is connected across the coax panel input jack 203. The right and left halve windings 201 of the current probe 200 are connected for addition of induced voltages. The current probe 200 is connected to the oscilloscope 50 by means of a 50 ohm coaxial cable.

Figure 9:
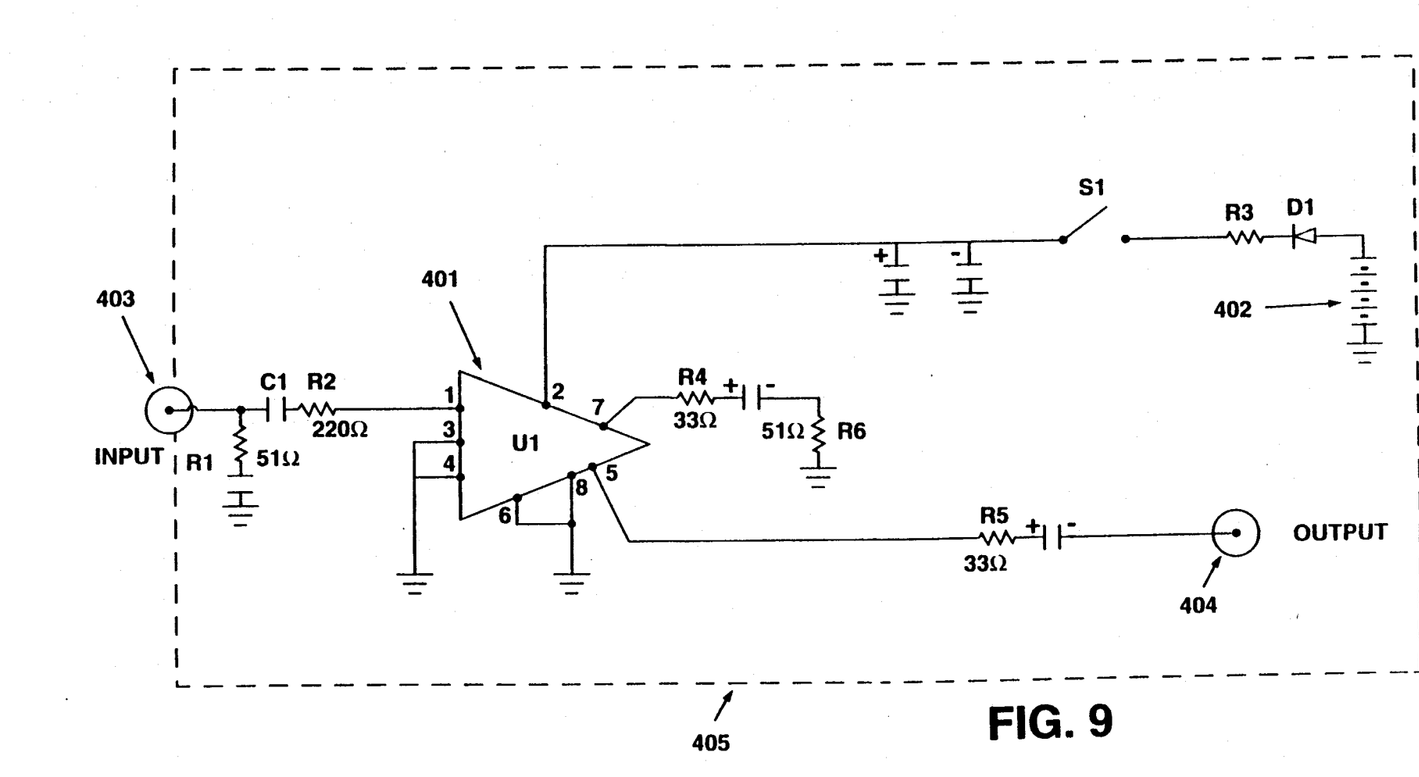
FIG. 9 is a schematic of a low noise current probe amplifier.

A current probe amplifier 400 is sometimes required when the cable 10 to be tested is long and thin. As shown in FIG. 9, the probe amplifier 400 is an ultra low noise amplifier utilizing a linear integrated circuit "transresistance amplifier" (Signetics SE5212) 401, powered by four 1.5 volt penlight batteries 402. The probe amplifier 400 is housed in a shielded metal box 405. The input jack 403 and the output jack 404 are 50 ohm coaxial cable jacks. The other circuit elements shown in FIG. 9, are representative components typically used by one knowledgeable in the art and are not described in detail.

Figure 10:
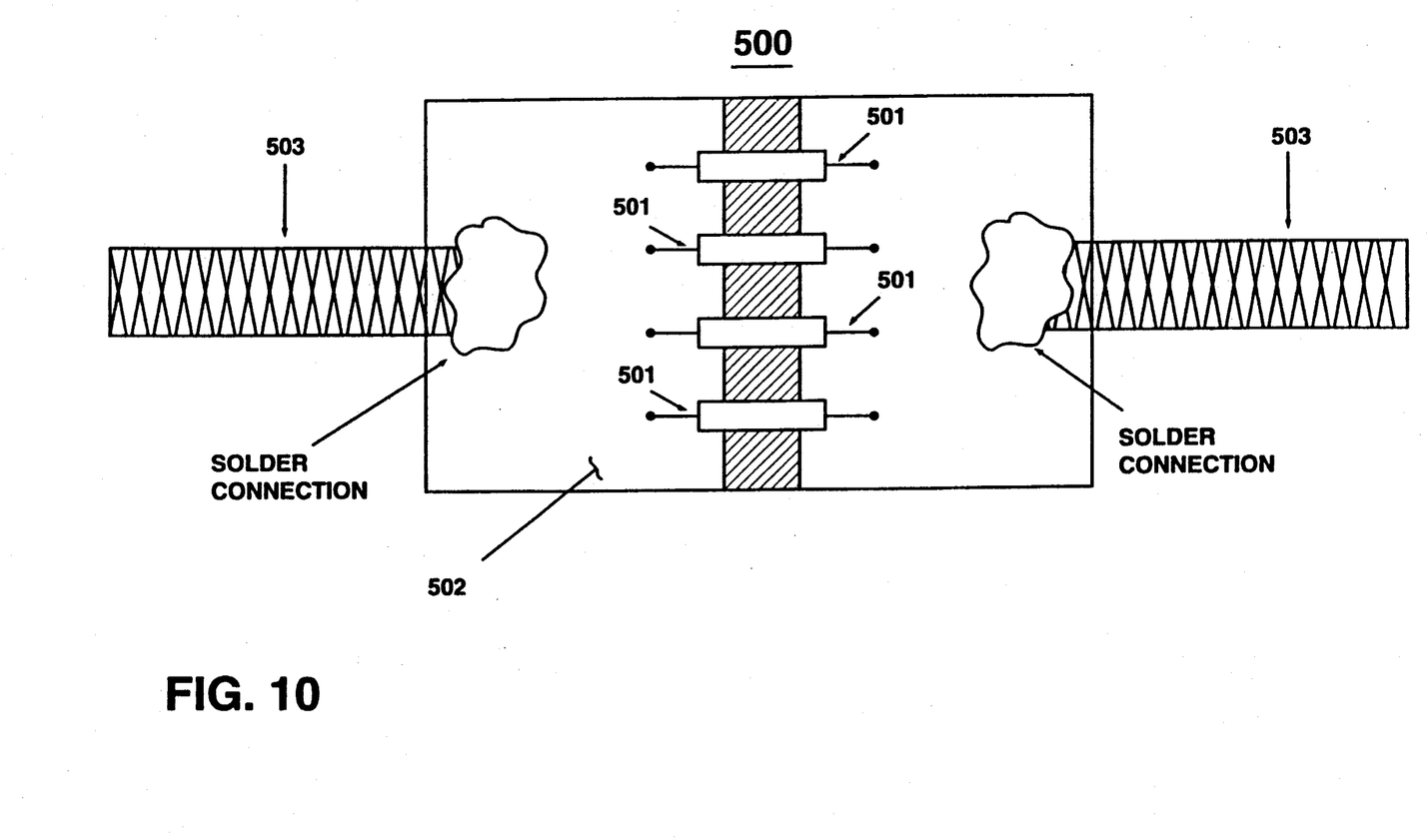
FIG. 10 shows the method of connection of calibration resistors.
Figure 11:
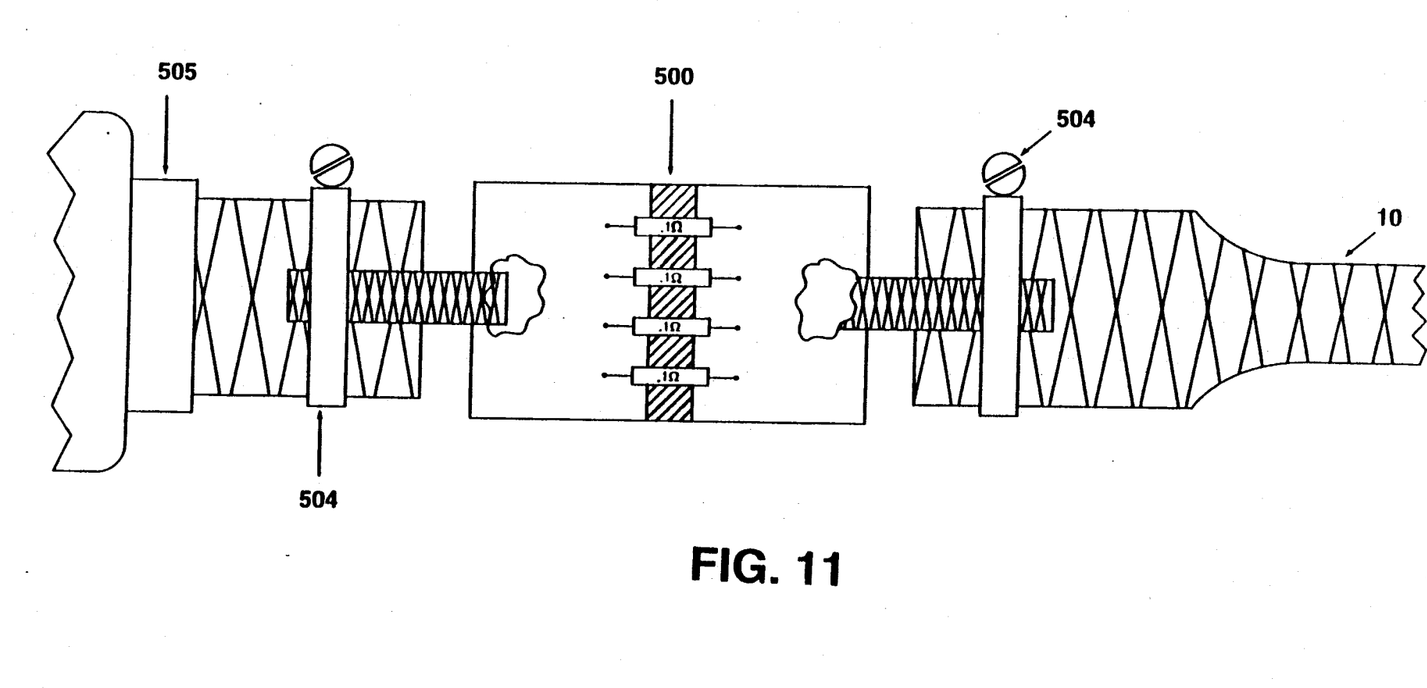
FIG. 11 shows the calibration resistors inserted into the circuit under test.

The calibration resistances 501 are low-valued resistances of 0.1, 0.05, and 0.025 ohms. 0.1 ohm resistors are shown in FIGS. 10 and 11. These resistors 501 are soldered to small area (1.5 in$^2$) tinned copper circuit boards 502 to which 1 inch wide braided metal straps 503 are connected. These calibration resistors are used for initial calibration of a cable shield path 10. By this procedure, shown in FIG. 11, the cable 10 under test is initially disconnected at one end and the calibration resistance is inserted by means of hose clamps 504 between a panel connector 505 and a cable connector 504. From measurements on the cable shield 10 taken with and without the calibration resistance, a baseline value of end-to-end cable shield resistance can be obtained for each cable 10 in a system requiring periodic inspection.

Numerous other changes, modifications, and adaptations of the disclosed invention can be made by those having ordinary skill in the art without departing from the spirit of the disclosed invention. It is intended that such changes, modifications, and adaptations of the invention will be within the scope of the following appearing claims.

I claim:

1. A method of measuring resistance in a circuit without disconnecting said circuit comprising the steps of:

inductively inducing a repetitive current pulse in a circuit under test;

inductively sampling said repetitive current pulse induced in said circuit under test; and displaying a voltage waveform proportional to said repetitive current pulse induced in said circuit under test on a display means, and wherein the steps of inductively inducing and inductively sampling are performed at axially spaced locations of said circuit under test, wherein said display means is calibrated by inserting a reference resistance into said circuit under test to produce a reference voltage waveform on said display means, and wherein said voltage waveform enables a measurement of said resistance in said circuit under test, and further wherein said voltage waveform is approximately a trapezoidal voltage waveform wherein the droop of said trapezoidal voltage waveform is related to said resistance in said circuit under test by the following equations;

$R_x = R_c D_1/(D_2 - D_1)$ $D_1 = (V_1 - V_2)/V_1 = R_x T/L$ $D_2 = (V_1 - V_3)/V_1 = (R_x + R_c)T/L$ where:

$R_x$ = unknown resistance in said circuit under test $R_c$ = known value of said reference resistance inserted into said circuit under test to calibrate said display means $D_1$ = droop of said voltage waveform of said circuit under test $D_2$ = droop of said reference voltage waveform of said circuit under test with said reference resistance inserted $T$ = duration of said trapezoidal pulse from $V_1$ to $V_2$ $L$ = equivalent inductance in Henries of said circuit under test, and $V_3$ = voltage at the end of said reference voltage waveform where droop is measured when said reference resistance is inserted into said circuit under test.

2. An apparatus for measuring resistance in a circuit without disconnecting said circuit comprising:

means for inductively inducing a repetitive current pulse in a circuit under test;

means for inductively sampling said repetitive current pulse induced in said circuit under test, wherein said means for inductively inducing and said means for inductively sampling are axially spaced on said circuit under test, means for displaying a voltage waveform proportional to said repetitive current pulse induced in said circuit under test, means for calibration of said means for displaying a voltage waveform, means for inserting a reference resistance into said circuit under test, means for producing a reference voltage waveform, wherein said means for displaying a voltage waveform proportional to said repetitive current pulse induced in said circuit under test includes means for displaying a trapezoidal voltage waveform and also includes means for displaying droop of said trapezoidal voltage waveform and wherein said means for displaying a voltage waveform comprises a means for measuring said resistance in said circuit under test in which the following equations apply:

$R_x = R_c D_1/(D_2 - D_1)$ $D_1 = (V_1 - V_2)/V_1 = R_x T/L$ $D_2 = (V_1 - V_3)/V_1 = (R_x + R_c)T/L$ where:

$R_x$ = unknown resistance in said circuit under test $R_c$ = known value of said reference resistance inserted into said circuit under test $D_1$ = droop of said trapezoidal voltage waveform of said circuit under test $D_2$ = droop of said reference voltage waveform of said circuit under test with said reference resistance inserted $T$ = duration of said trapezoidal voltage waveform from $V_1$ to $V_2$ $L$ = equivalent inductance in Henries of said circuit under test, and $V_3$ = voltage at the end of said reference voltage waveform where droop is measured when said reference resistance is inserted into said circuit under test.

* * * * *